(12) United States Patent
Liu et al.

(10) Patent No.: US 8,552,754 B2
(45) Date of Patent: Oct. 8, 2013

(54) METHOD OF TESTING RELIABILITY OF SEMICONDUCTOR DEVICE

(75) Inventors: Xiaoyan Liu, Beijing (CN); Jiaqi Yang, Beijing (CN); Jinfeng Kang, Beijing (CN); Jingfeng Yang, Beijing (CN); Bing Chen, Beijing (CN)

(73) Assignee: Peking University (CN)

( * ) Notice: Subject to any disclaimer, the term of this patent is extended or adjusted under 35 U.S.C. 154(b) by 325 days.

(21) Appl. No.: 13/113,513

(22) Filed: May 23, 2011

(65) Prior Publication Data
US 2012/0299608 A1     Nov. 29, 2012

(51) Int. Cl.
*G01R 31/00*     (2006.01)

(52) U.S. Cl.
USPC .................................................. 324/750.03

(58) Field of Classification Search
USPC ............. 324/750.01–750.3, 762.01–762.1; 257/48; 438/14–18
See application file for complete search history.

(56) References Cited

U.S. PATENT DOCUMENTS

| | | | |
|---|---|---|---|
| 6,521,469 B1 * | 2/2003 | La Rosa et al. | 438/17 |
| 7,562,318 B2 * | 7/2009 | Ang et al. | 716/136 |
| 7,710,141 B2 * | 5/2010 | La Rosa et al. | 324/750.3 |

OTHER PUBLICATIONS

Grasser, Tibor, et al., "A Rigorous Study of Measurement Techniques for Negative Bias Temperature Instability"; IEEE Transactions on Device and Materials Reliability, vol. 8, No. 3, Sep. 2008; pp. 526-535.

* cited by examiner

*Primary Examiner* — Tung X Nguyen
(74) *Attorney, Agent, or Firm* — Schwegman Lundberg & Woessner, P.A.

(57) ABSTRACT

The invention provides a method of testing reliability of a semiconductor device, wherein the semiconductor device has negative bias temperature instability NBTI. The method comprises steps of: measuring a NBTI curve of a first set of semiconductor devices; measuring 1/f noise power spectrum density and drain current at a predetermined frequency for the first set of the semiconductor devices, under a condition that the first set of the semiconductor devices are biased at a gate electric field; measuring an equivalent oxide thickness EOT of gate dielectric of the first set of the semiconductor devices; measuring 1/f noise power spectrum density and drain current at the predetermined frequency for a second set of semiconductor devices, under a condition that the second set of the semiconductor devices are biased at the gate electric field; measuring an EOT of gate dielectric of the second set of the semiconductor devices; and evaluating a degradation characteristic of the second set of the semiconductor devices by using the NBTI curve of a first set of the semiconductor devices. The method saves the time required for testing the reliability of a large numbers of semiconductor devices, and will not cause damages to the second set of semiconductor devices.

17 Claims, 3 Drawing Sheets

METHOD OF TESTING RELIABILITY OF SEMICONDUCTOR DEVICE

BACKGROUND OF THE INVENTION

1. Field of Invention

The present invention relates to a method of testing reliability of a semiconductor device and circuit, and particularly to a method of performing a non-destructive rapid test on negative bias temperature instability (NBTI) of a pMOSFET.

2. Description of Prior Art

Reliability testing of the semiconductor device is a key technical issue in the field of integrated circuit technology. Negative bias temperature instability (NBTI) of the p-type field effect transistor (pMOSFET) in CMOS circuits is one of the main reliability concern in the current semiconductor technology, which indicates the degradation of pMOSFET characteristics under negative gate voltage and temperature stress, such as increase in threshold voltage $V_{th}$ and reduction in drain current $I_d$. NBTI induces continuous performance degradation of pMOS transistors with stress time, and ultimately makes the failure of device and even circuit.

The aggressive scaling down of MOSFETs integrated circuit technology requires the continuous reduction of gate oxide dielectric thickness. Although the wide integration of SiON gate dielectric or high-K gate dielectric in nowadays semiconductor industry has effectively suppressed gate leakage, it makes NBTI more significant than ever before.

A conventional NBTI testing method comprises that under a high temperature, a constant voltage stress between 8 MV/cm to 12 MV/cm which is much higher than an operating voltage may be applied to the gate electrode of a MOSFET. A stress time is generally thousands of seconds to several ten thousands of seconds and more. Then, a degradation of the electrical parameter, such as the device threshold voltage, with the stress time may be measured for a certain time interval. For example, following documents disclose conventional NBTI testing method in detail:

Document 1: US Patent Application No. 2003/0231028 A1;
Document 2: T. Grasser, P. Wagner, P. Hehenberger, W. Goes, and B. Kaczer, "A Rigorous Study of Measurement Techniques for Negative Bias Temperature Instability," IEEE Trans. Device Mater. Rel., vol. 8, no. 3, 2008, pp. 526-535.

Consequently, the conventional NBTI testing is a time-consuming work and of a heavy workload. In addition, a serious degradation has occurred to the electrical parameters of the device sample which can not be used any more after the NBTI stress test.

Therefore, how to improve efficiency of the NBTI test and to reduce a loss rate of the test sample have important significances for the integrated circuit technology.

SUMMARY OF THE INVENTION

Accordingly, a main object of the present invention is to provide a method of performing a non-destructive rapid test on a semiconductor device, especially NBTI characteristic of a pMOSFET.

According to the present invention, a method of testing reliability of a semiconductor device is provided, wherein the semiconductor device has negative bias temperature instability NBTI. The method comprises steps of: measuring a NBTI curve of a first set of semiconductor devices; measuring 1/f noise power spectrum density and drain current at a predetermined frequency for the first set of the semiconductor devices, under a condition that the first set of the semiconductor devices are biased at a gate electric field; measuring the equivalent oxide thickness (EOT) of gate dielectric of the first set of the semiconductor devices; measuring 1/f noise power spectrum density and drain current at the predetermined frequency for a second set of semiconductor devices, under a condition that the second set of the semiconductor devices are biased at the gate electric field; measuring EOT of gate dielectric of the second set of the semiconductor devices; and evaluating a degradation characteristic of the second set of the semiconductor devices by using the NBTI curve of a first set of the semiconductor devices.

Compared with the conventional NBTI testing method, the present invention has advantages as follows:

In the present invention, 1/f noise may be utilized to evaluate NBTI of the second set of samples. Since the 1/f noise may be tested under a room temperature, and a testing voltage thereof is much less than a stress voltage in the conventional NBTI testing method, the testing method of the present invention is non-destructive, and will not cause a degradation of electric characteristic of the tested samples, which has a great help for improving efficiency of the usage of the samples.

Since only the NBTI curve of the first set of samples and the 1/f noise power spectrum density of the second set of samples are needed to be tested in the present invention, the testing time may be efficiently reduced and the efficiency may be improved. The efficiency improvement is more significant with more number of the second set of samples.

The method is adapted to a prediction on the degradation of the NBTI characteristic for the oxide layer which has bulk traps, such as SiON gate dielectric or high-K gate dielectric.

The testing method of performing the non-destructive rapid test on the NBTI of the high-K dielectric as proposed in the present invention may efficiently obtain NBTI characteristics of a plurality of sets of samples of the high-K dielectric with same material and different interface conditions or with different bulk defect conditions.

DETAILED DESCRIPTION OF PREFERRED EMBODIMENTS

Figure 1:
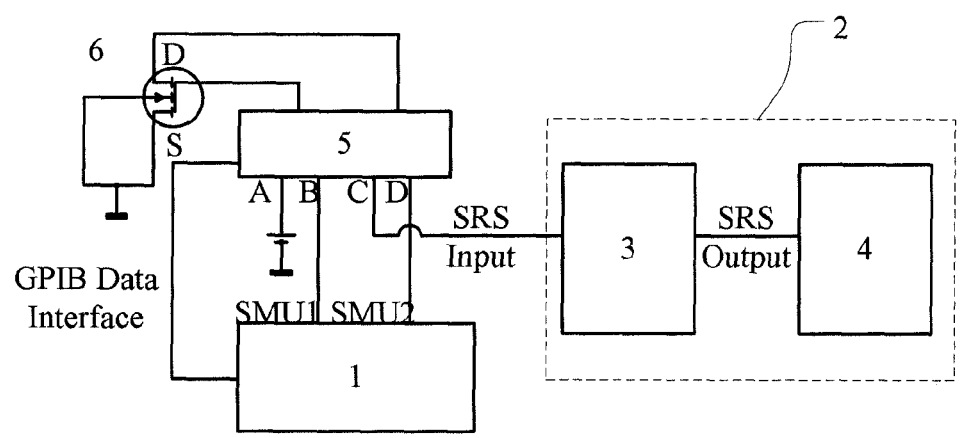
FIG. 1 shows a schematic block diagram of a testing system used in the testing method according to the present invention.

Inventors have found and established an association between a $V_{th}$ degradation value in the initial phase of a NBTI curve of pMOSFET and power spectrum density amplitude of 1/f noise, and has further provided a novel method of testing reliability of a semiconductor device based on the association.

Investigations on the NBTI mechanism have been lasted for more than 40 years, it is commonly considered that the physical mechanism of NBTI is a co-contribution of generation of interface state $N_{it}$ and trapping into near-interface bulk trap $N_t$. For generation of the interface state, a commonly accepted reaction-diffusion model and a modified model thereof consider that depassivation of Si—H bonds at the interface and a subsequent dimerization and diffusion processes of H particles in a dielectric layer are cooperative, which causes that shift of the threshold voltage may evolve with stress time in the form of power-law. The interface reaction and the dimerization process are rapid, and the subsequent degradation will be dominated by the long-term diffusion process. Therefore, there is a transition of NBTI degradation exponent from short to long period. On the other hand, trapping into near-interface bulk traps is an extremely fast saturated process, which is not sensitive to time, but mainly depends on the applied bias voltage on the gate. Considering co-contribution of the above two parts of defects, the degradation of $V_{th}$ with stress time may be expressed as:

$$\Delta V_{th} = -\frac{\Delta Q_{ot}(t) + \Delta Q_{it}(t)}{C_{ox}} = \Delta V_{th,ini} + Bt^n \quad \text{(Formula 1)}$$

where $\Delta Q_{ot}(t)$ and $\Delta Q_{it}(t)$ represent degradations of bulk trap charges and interface state charges with time, respectively; $C_{ox}$ is a capacitance of the gate oxide layer of the device; $\Delta V_{th,ini}$ is initial threshold voltage degradation; B is a constant in a particular electric field; and n is an exponent of the time t, which is related to the type of H particles diffused in the bulk and the existence of the bulk traps.

Trapping into pre-existing bulk traps $N_t$ mainly results in the initial threshold voltage degradation $\Delta V_{th,ini}$ of the NBTI. Since thickness-normalized initial $V_{th}$ degradation value $\Delta V_{th,ini}/EOT$ is proportional to the bulk trap density $N_t$, $\Delta V_{th,ini}$ may be expressed as:

$$\Delta V_{th,ini} = \frac{EOT \cdot q \cdot f(E_{ox}) \cdot N_t}{\varepsilon} \quad \text{(Formula 2)}$$

where EOT represents an equivalent oxide thickness of the gate oxide; q represents electric quantity of a single electron; $f(E_{ox})$ represents a probability that the bulk traps are occupied by holes under a certain gate oxide electric field; and $\varepsilon$ represents a dielectric constant of $SiO_2$.

On the other hand, the 1/f noise is a common low frequency noise form in the semiconductor device. The main sources of 1/f noise are the bulk traps within gate dielectric. The near-interface trap randomly captures and releases charges, which causes random fluctuations of channel mobility and the number of channel carriers. The time constant related to this process may result in a significant increase of the noise signal power in a low frequency band.

In the current widely used uniform 1/f noise model, a formula regarding the noise spectrum density and the bulk trap density is expressed as:

$$N_t = \frac{S_{Id} C_{ox}^2 WL f g_m^2 (V_g - V_{th})^2 \gamma}{q^2 k T I_d^2} \quad \text{(Formula 3)}$$

where $N_t$ represents the density of the bulk trap; $S_{Id}$ represents the noise spectrum density; W and L are width and length of channel in a MOS device, respectively; $g_m$ is transconductance of the device; r is an attenuation coefficient; T is a testing temperature; $I_d$ is a drain current passing through the channel under a noise testing bias; q is electric quantity of a single electron; and k is a Boltzmann constant.

If the noise testing on the plurality of samples is performed in the same gate electric field, values of $C_{ox} \times (V_g - V_{th})$ for respective samples are identical. Thus, $S_{Id}/I_d^2$ is proportional to the bulk trap density $N_t$ according to the uniform 1/f noise model, which may be simply expressed as:

$$N_t = a \bullet S_{Id}/I_d^2 \quad \text{(Formula 4)}$$

where a is a parameter depending on the temperature and the gate electric field.

Formula 4 may be applied to Formula 2, so as to replace $N_t$ in Formula 2. Then, a relationship of the initial threshold voltage degradation $\Delta V_{th,ini}$ and the noise spectrum density $S_{Id}$ may be obtained as:

$$\Delta V_{th,init} = k \frac{EOT \cdot S_{Id}}{I_d^2} \quad \text{(Formula 5)}$$

where k is a correlated coefficient of $\Delta V_{th,ini}/EOT$ and $S_{Id}/Id^2$. If the plurality of samples which have the same gate dielectrics are measured at the same temperatures and in the same gate electric fields, the correlated coefficient k is a constant. That is, the thickness-normalized initial threshold voltage shift $\Delta V_{th,ini}/EOT$ is proportional to $S_{Id}/I_d^2$.

Formula 5 may be applied to Formula 1, so as to obtain a curve representing a degradation of the threshold voltage $V_{th}$ with the time t, i.e. a NBTI curve as follows:

$$\Delta V_{th} = k \frac{EOT \cdot S_{Id}}{I_d^2} + Bt^n \quad \text{(Formula 6)}$$

For the high-K gate dielectric consisted of the same material, degradation tendencies of the threshold voltages for the plurality of different samples with time are identical. The degree of the degradation depends on the initial threshold voltage degradation $\Delta V_{th,ini}$ at the short beginning. In a case that the degradation curve of the NBTI for the first set of samples with time has been measured, the curve of the threshold voltage $V_{th}$ shift with the time t of the second set of samples may be calculated based on the measurement result of the 1/f noise power spectrum, without substantially repeated measurements on other samples.

Hereinafter, a preferable embodiment of the method for testing reliability of the semiconductor device as described above will be discussed in detail.

FIG. 1 shows a schematic block diagram of a testing system used in the testing method according to the present invention. The testing system comprises an electric measurement system 1, a noise measurement system 2, and a switching 5 which selectively connects one of the electric measurement system 1 and the noise measurement system 2 to a sample 6.

The sample 6 is placed on a probe station (not shown). A source electrode, a drain electrode, a gate electrode, and a substrate of the MOSFET are connected to the probe pins, respectively. The probe pins are connected to output terminals of the probe station.

The switching apparatus 5 may use e.g. an 8×12 switch matrix 7174A purchased from the US Keithley Inc.

The electric measurement system 1 may use e.g. a semiconductor parameter measurement system KI-4200/2600 purchased from the US Keithley Inc., which may be used for measuring an I-V characteristic of the device and the NBTI characteristic of the device.

The noise measurement system 2 may comprise a current preamplifier 3 (e.g. a low-noise current preamplifier SR570 purchased from the US Stanford Research Systems Inc., which uses a build-in accumulator DC power supply), and a network analyzer 4 (e.g. a FFT network analyzer SR 770 purchased from the US Stanford Research Systems Inc., which uses an external DC power supply) connected to the current preamplifier 3.

Figure 2:
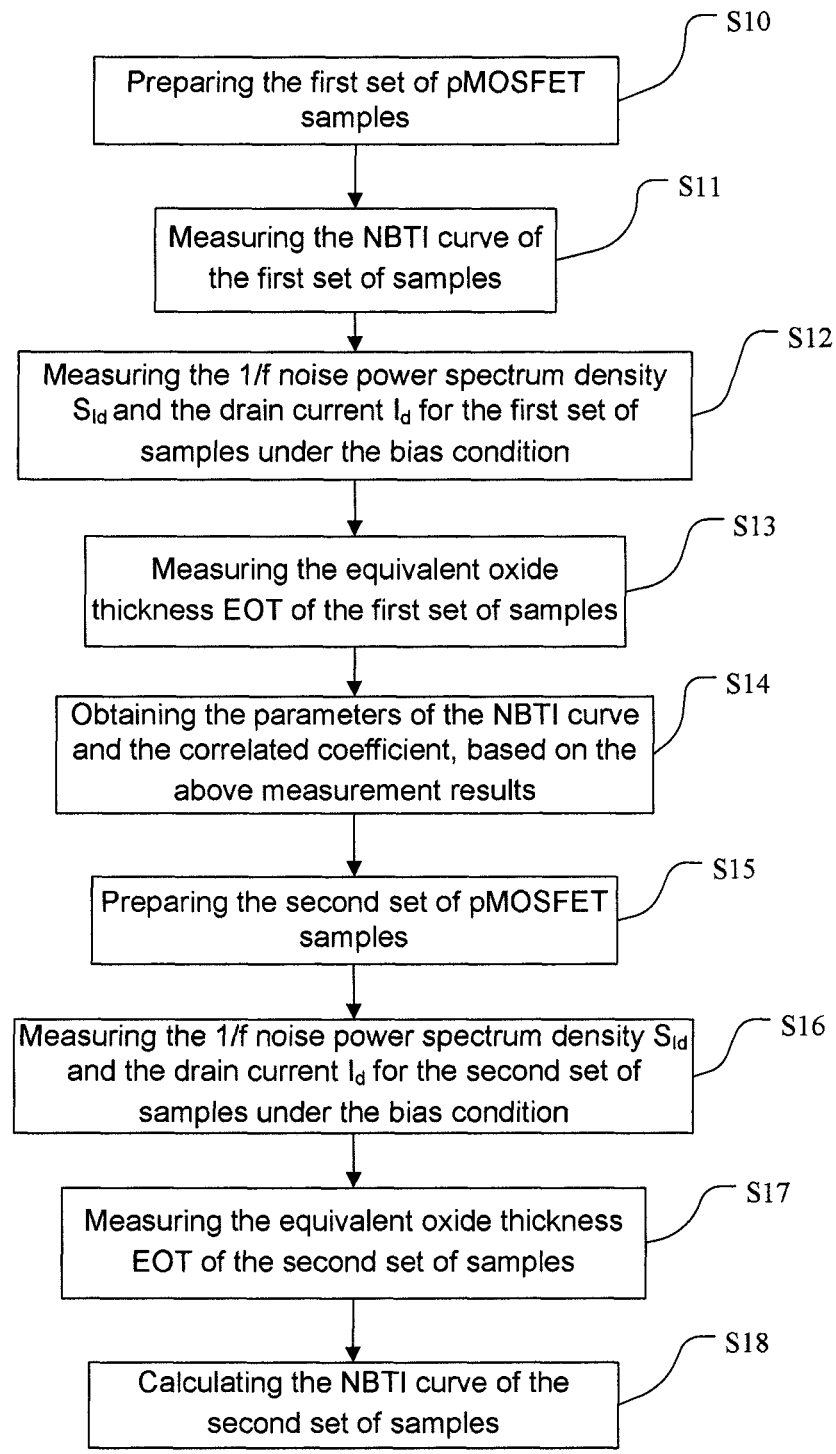
FIG. 2 shows a flowchart of a first embodiment of the testing method according to the present invention.

FIG. 2 shows a flowchart of a first embodiment of the testing method according to the present invention.

Firstly, one pMOSFET may be manufactured as a set of samples according to a 65 nm process (step S10).

The gate dielectric of the pMOSFET may be SiON or any of high-K dielectric materials selected from the groups consisted of $HfO_2$, $La_2O_3$, $Al_2O_3$, $TiO_2$, $Ta_2O_5$, and $ZrO_2$, and may also be high-k dielectric doped with metal elements.

Then, the samples may be placed on the probe station. The samples may be connected to the electric measurement system 1 by the switching apparatus 5. A NBTI stress of 125° C., 9.5 MV/cm may be applied to the samples for 1000 s, so as to perform the NBTI measurement (step S11). In order to avoid a recovery effect during the NBTI testing, an on-the-fly online testing technique may be used for monitoring a variation of the threshold voltage in real time. Finally, a curve of the threshold voltage $V_{th}$ shift with the time t, i.e. a curve of NBTI degradation with time of the samples, may be obtained.

Next, the samples may be connected to the noise measurement system 2 by the switching apparatus 5, so that the 1/f noise power spectrum measurement and the drain current measurement may be performed on the samples (step S12). The 1/f noise power spectrum measurement may be performed under the room temperature and in a linear area of an output characteristic curve $I_d$-$V_d$ of the samples.

In the 1/f noise power spectrum measurement process, the gate electrodes of the samples may be connected to the external DC power supply by the switching apparatus 5, the drain electrodes may be connected to the current preamplifier 3 in the noise measurement system 2, and the source electrodes may be connected to the ground. When the build-in DC power supply in the current preamplifier 3 provides the drain electrodes with voltages, the current preamplifier 3 detects drain current signals passing through the channels of the samples, and amplifies the DC-component filtered drain current signals in low-noise level, and then transmits the amplified filtered drain current signals to the network analyzer 4. After a transform by the network analyzer, a 1/f noise half power spectrum density curve may be output directly. Then, the half power may be squared, and the 1/f noise power spectrum density curve $S_{Id}(f)$ may be obtained.

Subsequently, the samples may be connected to the electric measurement system 1 again by the switching apparatus 5. Under the same bias condition for measuring the 1/f noise, the drain current $I_d$ of the samples may be measured.

Then, the equivalent oxide thickness EOT of the samples may be obtained according to the conventional method well-known in the art (e.g., by measuring the C-V curve of the samples) (step S13).

Next, the correlation of the NBTI curve and the noise power spectrum density curve of the samples may be analyzed (step S14).

The initial $V_{th}$ degradation value $\Delta V_{th,ini}$ at the beginning of the NBTI curve and the parameters B, n of the NBTI curve may be obtained by fitting the NBTI curve measured in step S11 using Formula 1 which represents the shift of the threshold voltage with time.

The value of $S_{Id}$ at a particular frequency such as 25 Hz may be obtained based on the noise power spectrum density curve $S_{Id}(f)$ measured in step S12.

The value of k may be calculated using the obtained initial $V_{th}$ degradation value $\Delta V_{th,ini}$, the obtained $S_{Id}$ value at the particular frequency, the measured drain current $I_d$ and the equivalent oxide thickness EOT, according to Formula 5.

Preferably, the first set of samples may comprise a plurality of pMOSFET, and the correlation of the NBTI curve and the noise power spectrum density curve of the samples may be analyzed according to the following steps.

The first set of samples comprises e.g. 5 pMOSFETs. For all of the 5 pMOSFETs, the NBTI curve may be measured in step S11, and Formula 1 representing the shift of the threshold voltage with time may be used for fitting the NBTI curve to obtain the initial $V_{th}$ degradation value $\Delta V_{th,ini}$ at the beginning of the NBTI curve.

For all of the 5 pMOSFETs, the noise power spectrum density curve $S_{Id}(f)$ may be measured in step S12 to obtain the $S_{Id}$ at the particular frequency such as 25 Hz.

A ratio $S_{Id}@25\ Hz/I_d^2$ of the obtained $S_{Id}$ (i.e. the $S_{Id}$ at the particular frequency) to the measured drain current $I_d$ may be used as an x-coordinate, and the ratio $\Delta V_{th,ini}/EOT$ of the obtained initial $V_{th}$ degradation value $\Delta V_{th,ini}$ to the EOT of the gate dielectric, i.e., the normalized initial $V_{th}$ degradation value $\Delta V_{th,ini}$, may be used as a y-coordinate, so as to draw a correlation curve of the normalized initial $V_{th}$ degradation value $\Delta V_{th,ini}/EOT$ v.s. $S_{Id}@25\ Hz/I_d^2$ for all of the 5 pMOSFETs. As shown in Formula 5, the correlation curve presents a direct proportion. A slope of the correlation curve may be calculated as a common correlated coefficient k for the 5 samples.

The above preferable approach of this step further improves the calculation result accuracy of the correlated coefficient k by processing experimental results of the plurality of samples.

Then, the second set of pMOSFET samples may be prepared (step S15). For the second set of samples, the NBTI curve of the samples may be obtained by measuring the 1/f noise, without measuring the NBTI curve directly.

The first and the second sets of samples include the gate dielectric of the same material, but the thickness, doping of the gate dielectric and the interface conditions thereof may be different.

With the measurement apparatus and method similar with those in step S12, the noise power spectrum density $S_{Id}$ at the particular frequency (25 Hz) and the drain current $I_d$ under the bias condition of the noise power spectrum density measurement may be measured for each of the second set of samples (S16).

In steps S12 and S16, the measurements on respective samples are performed in the same gate electric field, so as to guarantee that densities of the channel charges are identical and comparable, and the same frequency may be selected as the particular frequency. Furthermore, the low-frequency 1/f noise measurement may be repeated for several times, and then an average thereof may be used for improving and assuring accuracy of the testing result, so that the accuracy of the prediction result for the NBTI degradation may be significantly high.

Then, the measurement apparatus and method similar with those in step S13 may be used for measuring the EOT for each of the second set of samples (step S17).

The parameters B, n and the correlated coefficient k obtained from the first set of samples in step S14 and $S_{Id}$, $I_d$ measured in step S16 may be used for calculating the NBTI curve of each of the second set of samples (step S18).

In step S18, the initial $V_{th}$ degradation value $\Delta V_{th,ini}$ of each of the second set of samples may also be calculated according to Formula 5.

Figure 3:
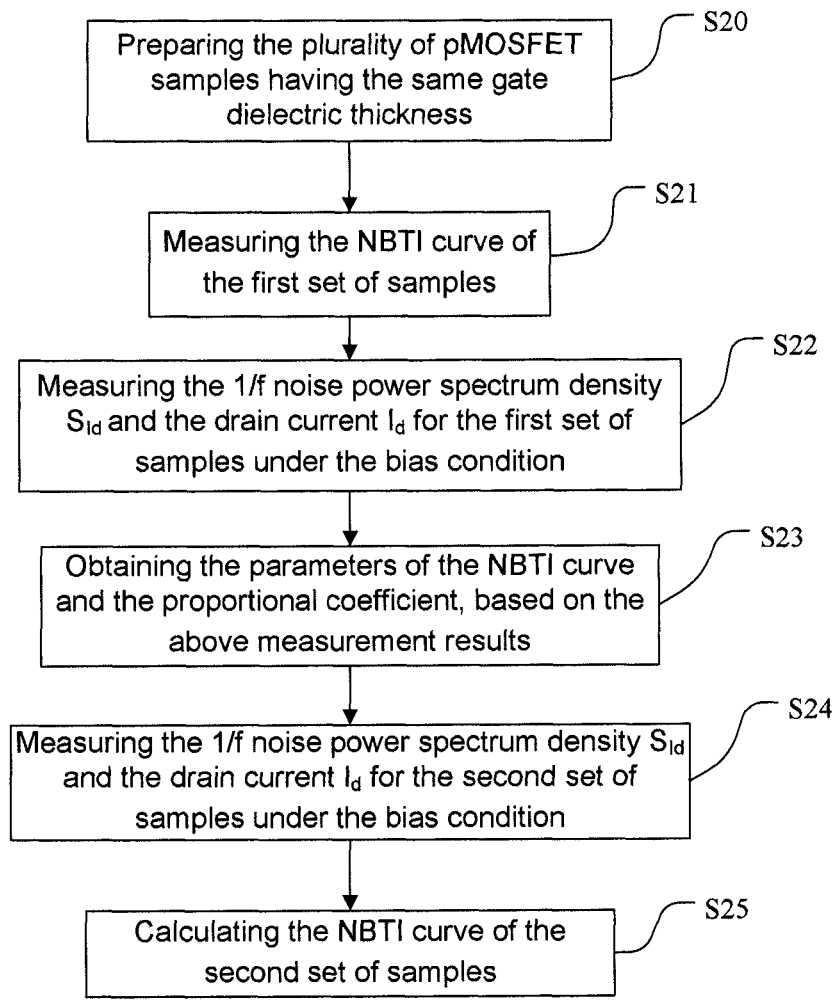
FIG. 3 shows a flowchart of a second embodiment of the testing method according to the present invention.

FIG. 3 shows a flowchart of a second embodiment of the testing method according to the present invention.

In the second embodiment, the first and the second sets of samples are samples chosen from a plurality of semiconductor devices manufactured at the same batch (step S20). Hence, the gate dielectric of the plurality of the semiconductor devices are with the same high-K dielectric materials, and also the EOTs thereof are approximately the same. Therefore, the measurement of EOT may be omitted.

For example, in an integrated circuit including a processor of high-K gate dielectric, different dopings may be required for a circuit element of some module, in order to adjust the threshold voltage. One pMOSFET may be selected as the first set of samples. One pMOSFET on a critical path may be taken out for designing a Boolean multiplier.

Steps S21-S22 may be performed for the selected one pMOSFET. Steps S21-S22 are the same as steps S11-S12 as shown in FIG. 2, respectively.

Then, the correlation of the NBTI curve and the noise power spectrum density curve for the pMOSFET may be analyzed (step S23).

The initial $V_{th}$ degradation value $\Delta V_{th,ini}$ at the beginning of the NBTI curve and the parameters B, n of the NBTI curve may be obtained by fitting the NBTI curve measured in step S21 using Formula 1 which represents the shift of the threshold voltage with time.

The value of $S_{Id}$ at the particular frequency such as 25 Hz may be obtained based on the noise power spectrum density curve $S_{Id}(f)$ measured in step S22.

A value of k·EOT may be calculated using the above obtained initial $V_{th}$ degradation value $\Delta V_{th,ini}$, the obtained $S_{Id}$ at the particular frequency and the measured drain current $I_d$, according to Formula 5.

It has been known that in the batch of the semiconductor devices, the plurality of pMOSFETs have the same gate dielectric and EOT. Thus, k·EOT should also be a constant. In the second embodiment, it is not necessary to measure or calculate respective values of the EOT and the correlated coefficient k.

Then, in the plurality of pMOSFETs, a certain number of pMOSFETs may be selected as the second set of samples according to the practical requirement.

Steps S24 and S25 may be performed on each of the second set of samples.

Step S24 is completely the same as step S16 as shown in FIG. 2.

The NBTI curve of the second set of samples may be calculated using the parameters B, n obtained from the first set of samples in step S23 and the constant k·EOT and $S_{Id}$, $I_d$ measured in step S24, according to Formula 6 (step S25).

In step S25, the initial $V_{th}$ degradation value $\Delta V_{th,ini}$ for each of the second set of samples may also be calculated according to Formula 5.

The above is only the preferred embodiments of the present invention and the present invention is not limited to the above embodiments. Therefore, any modifications, substitutions and improvements to the present invention are possible without departing from the spirit and scope of the present invention.

What is claimed is:

1. A method of testing reliability of a semiconductor device, wherein the semiconductor device has negative bias temperature instability NBTI, the method comprising steps of:
   measuring a NBTI curve of a first set of semiconductor devices;
   measuring 1/f noise power spectrum density and drain current at a predetermined frequency for the first set of the semiconductor devices, under a condition that the first set of the semiconductor devices are biased at a gate electric field;
   measuring 1/f noise power spectrum density and drain current at the predetermined frequency for a second set of semiconductor devices, under a condition that the second set of the semiconductor devices are biased at the gate electric field; and
   evaluating a degradation characteristic of the second set of the semiconductor devices by using the NBTI curve of a first set of the semiconductor devices.

2. The method according to claim 1, wherein the first set of the semiconductor devices and the second set of the semiconductor devices are pMOSFETs.

3. The method according to claim 1, wherein the first set of the semiconductor devices and the second set of the semiconductor devices comprise gate dielectric of same materials.

4. The method according to claim 3, wherein the gate dielectric is SiON or high-K dielectric material.

5. The method according to claim 4, wherein the high-K dielectric material is one selected from the group consisting of $HfO_2$, $La_2O_3$, $Al_2O_3$, $TiO_2$, $Ta_2O_5$, and $ZrO_2$.

6. The method according to claim 5, wherein the high-K dielectric material is doped with a metal element.

7. The method according to claim 3, wherein a thickness of the gate dielectric of at least one of the semiconductor devices is different from that of other semiconductor devices in the first set of the semiconductor devices and the second set of the semiconductor devices, and the method further comprises, before the step of evaluating the degradation characteristic of the second set of the semiconductor devices, steps of:
   measuring an equivalent oxide thickness EOT of the gate dielectric of the first set of the semiconductor devices; and
   measuring an equivalent oxide thickness EOT of gate dielectric of the second set of the semiconductor devices.

8. The method according to claim 3, wherein the dopant used in the gate dielectric of at least one of the semiconductor devices is different from that used in the gate dielectric of other semiconductor devices in the first set of the semiconductor devices and the second set of the semiconductor devices.

9. The method according to claim 3, wherein a doping level for the gate dielectric of at least one of the semiconductor devices is different from that in the gate dielectric of other semiconductor devices in the first set of the semiconductor devices and the second set of the semiconductor devices.

10. The method according to claim 3, wherein an interfacial layer of the gate dielectric of at least one of the semiconductor devices is different from that of the gate dielectric of other semiconductor devices in the first set of the semiconductor devices and the second set of the semiconductor devices.

11. The method according to claim 1, wherein the first set of the semiconductor devices are samples specifically manufactured for testing.

12. The method according to claim 1, wherein the first set of the semiconductor devices and the second set of the semiconductor devices are semiconductor devices manufactured at a same batch.

13. The method according to claim 1, wherein the first set of the semiconductor devices comprise at least one semiconductor device.

14. The method according to claim 1, wherein the step of measuring 1/f noise power spectrum density at a predetermined frequency for the first set of the semiconductor devices is repeated for several times, and then the testing results are averaged.

15. The method according to claim 1, wherein the step of measuring 1/f noise power spectrum density at a predetermined frequency for the second set of the semiconductor devices is repeated for several times, and then the testing results are averaged.

16. The method according to claim 1, wherein the degradation characteristic of the second set of the semiconductor devices is an initial threshold voltage degradation value $\Delta V_{th, ini}$.

17. The method according to claim 1, wherein the degradation characteristic of the second set of the semiconductor devices is the NBTI curve.

* * * * *